(12) United States Patent
Siewert et al.

(10) Patent No.: US 12,543,294 B2
(45) Date of Patent: Feb. 3, 2026

(54) COOLING DEVICE

(71) Applicant: ERWIN QUARDER SYSTEMTECHNIK GMBH, Espelkamp (DE)

(72) Inventors: Georg Siewert, Pohlheim (DE); Alexander Heitbrink, Stemwede (DE)

(73) Assignee: ERWIN QUARDER SYSTEMTECHNIK GMBH, Espelkamp (DE)

( * ) Notice: Subject to any disclaimer, the term of this patent is extended or adjusted under 35 U.S.C. 154(b) by 154 days.

(21) Appl. No.: 18/378,448

(22) Filed: Oct. 10, 2023

(65) Prior Publication Data

US 2024/0121915 A1   Apr. 11, 2024

(30) Foreign Application Priority Data

Oct. 10, 2022   (DE) .................... 10 2022 126 106.9

(51) Int. Cl.
*H05K 7/20*   (2006.01)

(52) U.S. Cl.
CPC ....... *H05K 7/2039* (2013.01); *H05K 7/20272* (2013.01)

(58) Field of Classification Search
CPC . H01L 23/473; H01L 23/4338; H05K 7/2039; H05K 7/20272
See application file for complete search history.

(56) References Cited

U.S. PATENT DOCUMENTS

| | | | |
|---|---|---|---|
| 4,882,654 A * | 11/1989 | Nelson | H01L 23/433 361/689 |
| 4,977,444 A | 12/1990 | Nakajima et al. | |
| 5,150,274 A * | 9/1992 | Okada | H01L 23/4338 361/689 |
| 2007/0091569 A1 | 4/2007 | Campbell et al. | |
| 2022/0021048 A1* | 1/2022 | Boddakayala | H01M 50/204 |

FOREIGN PATENT DOCUMENTS

| | | | |
|---|---|---|---|
| CN | 110662389 A | * | 1/2020 |
| DE | 693 16 066 T2 | | 4/1998 |
| DE | 693 16 038 T2 | | 7/1998 |
| DE | 693 21 070 T2 | | 6/1999 |

* cited by examiner

*Primary Examiner* — Eric S Ruppert
(74) *Attorney, Agent, or Firm* — Oliff PLC

(57) ABSTRACT

A cooling device dissipates heat of an object to be cooled, and has a cooling fluid line for the passage of cooling fluid, base component which has one or more cooling fluid line portions of the cooling fluid line, and heat sink for absorbing waste heat from the object to be cooled and for transmitting the waste heat to cooling fluid. The heat sink is arranged on a cooling component of the cooling device which has at least one cooling fluid line portion and which, while connecting that cooling fluid line portion to a cooling fluid line portion of the base component, is movably connected to the base component, so that the cooling component and the base component can be moved relative to one another either toward one another or away from one another if required, in order to adjust the position of the heat sink of the cooling component.

15 Claims, 10 Drawing Sheets

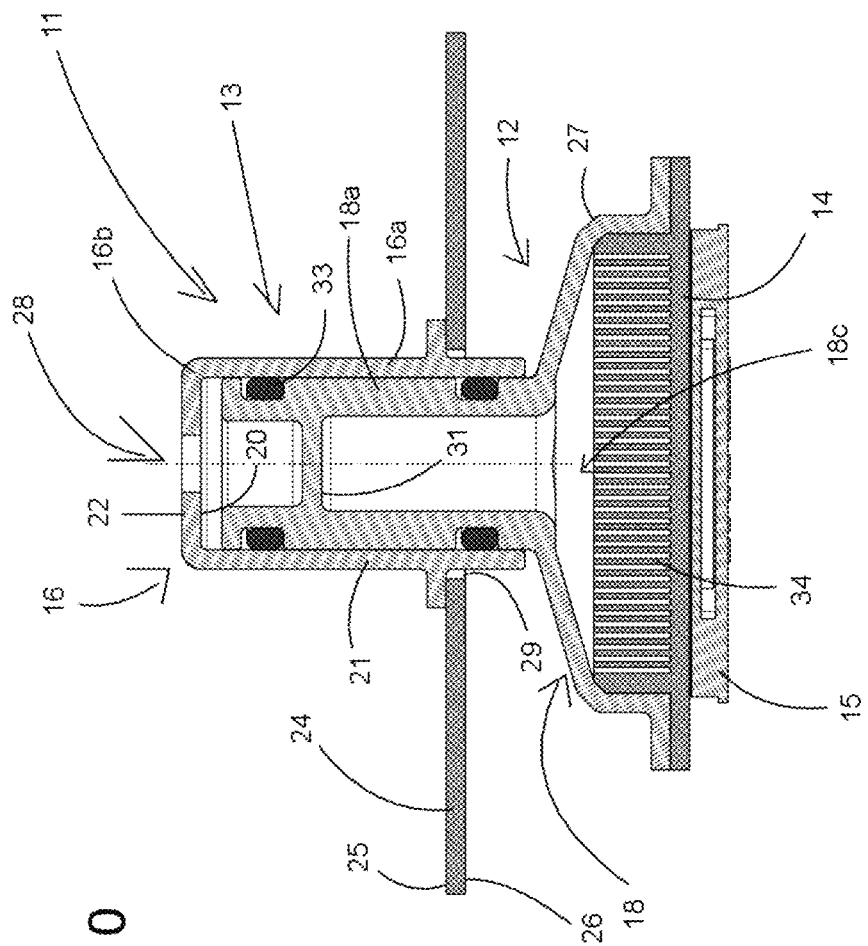

COOLING DEVICE

Figure 1:
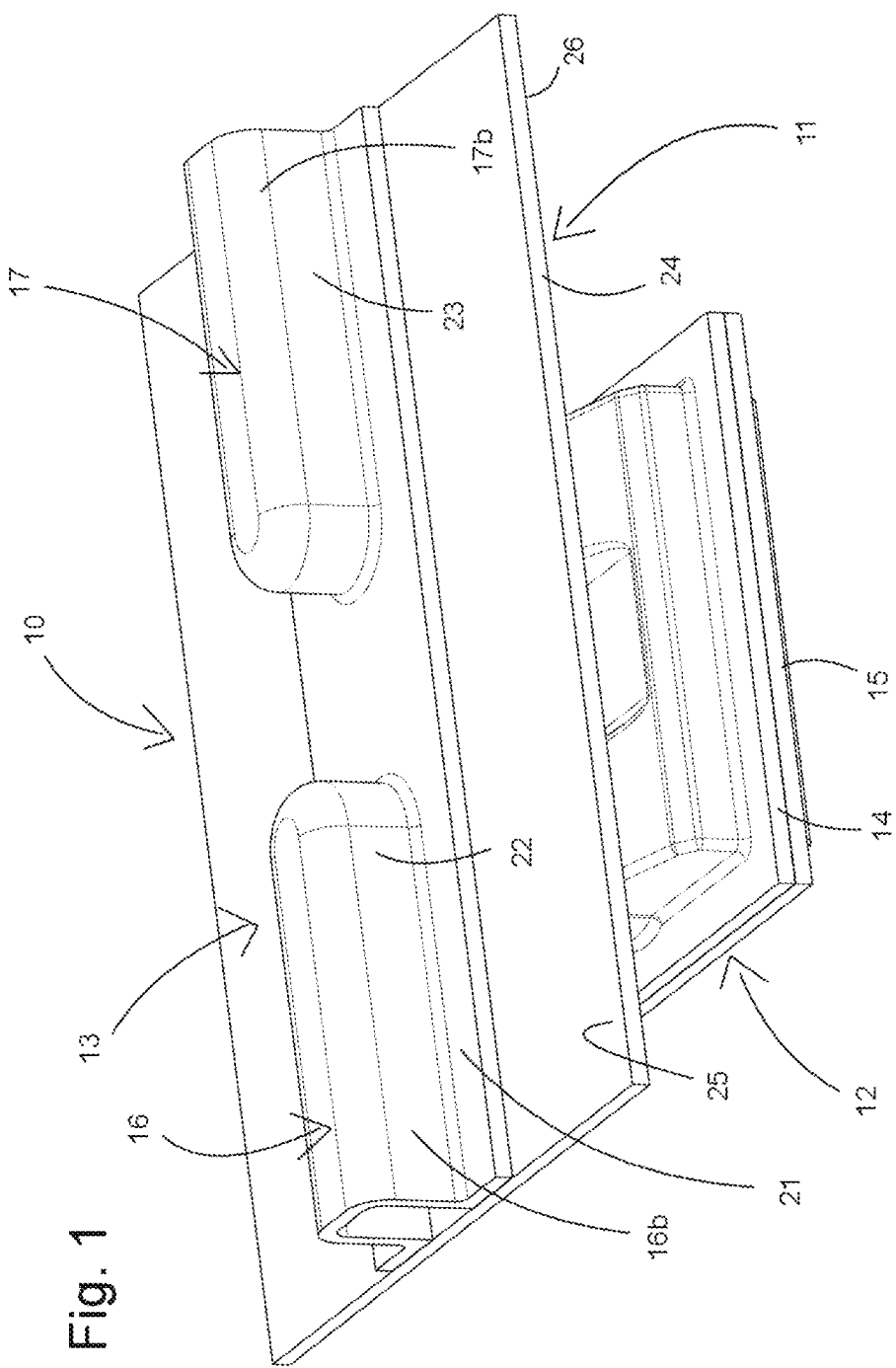

The present invention relates to a cooling device for dissipating heat of an object to be cooled, such as, for example, an electronic component, for example a processor chip, in particular arranged on a circuit board, having a cooling fluid line for the passage of cooling fluid, having a base component which has one or more cooling fluid line portions of the cooling fluid line, and having a heat sink, preferably a plate-shaped heat sink, consisting in particular of solid material, which can be arranged on an object to be cooled, for absorbing waste heat from the object to be cooled and for transmitting the waste heat to cooling fluid which flows through the cooling fluid line of the cooling device when the cooling device is in operation, in particular such a heat sink of metal or a thermally conducting metal alloy.

Cooling devices for dissipating heat from objects to be cooled are also referred to as heat exchangers and are used in many fields of technology. Such cooling devices are particularly important inter alia in the cooling of battery or rechargeable battery systems for electric vehicles, but also of power electronics components, of busbars or of processor chips. The cooling device mentioned at the beginning is generally part of a cooling system which includes a pump and other components, wherein the system ensures that cooling medium, such as, for example, water or the like, is continuously guided through the cooling device.

In the type of cooling device described at the beginning, the actual heat sink, which is generally in contact with the object to be cooled, is frequently part of the base component, which has cooling fluid line portions of the cooling fluid line of the cooling device for the supply and discharge of the cooling medium. It can, for example, form the integrally flat underside of the base component of the cooling device and be fitted therewith to the end faces of a plurality of adjacent objects to be cooled.

This structural form of cooling devices is disadvantageous, inter alia, when a plurality of adjacent objects are simultaneously to be cooled, the end faces of which that are to be cooled should theoretically lie in a plane but have slight height differences, for example owing to manufacturing tolerances. Although such tolerances can be compensated for to a certain extent by intermediate layers of thermally conductive paste, such thermally conductive paste, depending on its thickness, impairs the dissipation of heat from the objects to be cooled. In the case of particularly heat-sensitive components, or in the case of components with pronounced heat generation, such as, for example, high-power chips, this can be critical, so that only very thin layers of thermally conductive paste are permissible. However, the manufacturing tolerances frequently exceed this permissible layer thickness.

The object of the present invention is, therefore, to further develop the cooling devices mentioned at the beginning. In particular, it is to be possible to compensate for even relatively large manufacturing tolerances.

This object is achieved by a cooling device having the features of claim 1.

Accordingly, in a cooling device according to the invention, the heat sink is arranged on a cooling component of the cooling device which has a cooling fluid line portion of the cooling fluid line of the cooling device and which, while connecting that cooling fluid line portion in a fluid-conducting manner to a cooling fluid line portion of the base component, is movably connected to the base component, so that the cooling component and the base component can be moved relative to one another either toward one another or away from one another if required, in order to adjust the position of the heat sink of the cooling component.

According to the invention, the heat sink is thus advantageously no longer part of the base component of the cooling device but is arranged on, or optionally is part of, a cooling component which in this respect is separate and which in turn is movably connected to the base component. Advantageously, the relative position of the heat sink of the cooling component could thus be changed, for example, even after the base component of the cooling device has already been arranged in a static manner (before or even during operation of the cooling device).

It would thus be conceivable, for example, that the base component has a further (optionally unmovable) heat sink and that the cooling device, during use, is initially so positioned that this further heat sink is arranged on a first object to be cooled or—optionally with the interposition of a thermally conducting paste—is applied to the contact surface thereof that is to be cooled. The heat sink of the cooling component movably connected to the base component could then, owing to its movability relative to the base component, be arranged on another object to be cooled, which is situated, for example, roughly in the same plane as the first object to be cooled, but the surface of which that is to be cooled, or the contact surface of which, optionally deviates slightly from the contact surface of the first object to be cooled owing, for example, to manufacturing tolerances.

It will moreover be appreciated that, according to the invention, adjustments of the position of the heat sink of the cooling component are possible not only within the context of manufacturing tolerances but also—depending on the implementation of the basic concept according to the invention—on a larger scale.

As regards the heat sink of the cooling component movably connected to the base component, it is preferably of plate-shaped form and/or has cooling fins.

According to a preferred embodiment of the invention, the cooling fluid line portion of the base component (which cooling fluid line portion in particular is arranged in a static manner on the base component) and the cooling fluid line portion of the cooling component movably connected to the base component (which cooling fluid line portion in particular is arranged in a static manner on the cooling component) each have a preferably terminal, in particular hollow-cylindrical, hollow body (sub)portion. For the movable connection according to the invention of the base component and the cooling component, the two hollow body (sub) portions are connected together in an axially movable, fluid-conducting manner, in particular in a sliding manner. This is preferably effected in that one hollow body portion, in particular the hollow body portion of the cooling component, is inserted or pushed coaxially in an accurately fitting manner into the interior of the other hollow body portion, in particular the hollow body portion of the base component. In order to seal the two hollow body portions which are movable relative to one another with respect to one another, it can be provided to use a (at least one) gasket.

By way of the above-mentioned hollow body portions, the cooling fluid, for example, could be supplied to the cooling component, or to the cooling fluid line portion thereof. Expediently, when the cooling fluid has absorbed the waste heat of the object to be cooled absorbed by way of the heat sink, it is discharged from the cooling component again, specifically preferably back to the base component again or back into a further/different cooling fluid line portion of the base component. Accordingly, the cooling fluid would first flow into the (first) cooling fluid line portion of the base component, then pass into the cooling fluid line portion of the cooling component and thereafter into the further cooling fluid line portion of the base component.

Generally speaking, it can accordingly be provided in accordance with a further form of the above-mentioned embodiment that the cooling fluid line portion of the cooling component movably connected to the base component has a second, preferably terminal, in particular hollow-cylindrical, hollow body (sub)portion, that a further or second cooling fluid line portion of the base component has a preferably terminal, in particular hollow-cylindrical, hollow body (sub) portion, and that, for the movable connection of the base component and the cooling component, these two hollow body (sub)portions are also connected together in an axially movable and fluid-conducting manner, in particular in a sliding manner. This is likewise preferably effected in that one hollow body portion, in particular the second hollow body portion of the cooling component, is inserted coaxially in an accurately fitting manner into the interior of the other hollow body portion, in particular the hollow body portion of the further cooling fluid line of the base component, preferably likewise with the use of at least one gasket which seals the two hollow body portions with respect to one another in a fluid-tight manner.

The heat sink of the cooling component can extend along a plane which runs at an angle, in particular perpendicular, to the two opposite movement directions in which the cooling component and the base component can be moved relative to one another toward one another or away from one another if required.

Moreover, an inner side of the heat sink, which extends in particular in a cross-axial plane (cross-axial with regard to the axial relative movement between the hollow body portions), can form one of the wall inner surfaces of the cooling fluid line portion of the cooling component which confine the cooling medium. Accordingly, the cooling medium, during operation of the cooling device, could/would flow directly past the heat sink on the inside and absorb the waste heat of the object to be cooled.

Preferably, wall inner surfaces of the cooling fluid line portion of the cooling component that are situated opposite the inner side of the heat sink can form force compensation surfaces, so that fluid pressure forces, in particular axial fluid pressure forces (axial with regard to the axial relative movement between the respective hollow body portions), that are effected by the pressure of a cooling fluid flowing through the cooling component and act on the inner side of the heat sink are neutralized in their effect by corresponding opposite fluid pressure forces, in particular axial fluid pressure forces, acting on these force compensation surfaces. As a result, despite the movability according to the invention of the cooling component relative to the base component, it is prevented, for example, that the movable heat sink—triggered by the fluid pressure—exerts forces on the contact surface of the object to be cooled thereby, which could otherwise be problematic in particular in the case of sensitive objects.

One of the force compensation surfaces can expediently be formed by a wall inner surface extending in particular cross-axially of the or each hollow body portion of the cooling component, which delimits a terminal connection channel, extending in particular cross-axially, of this hollow body portion, by way of which connection channel cooling fluid is able to flow from the cooling fluid portion of the base body to the cooling fluid portion of the cooling component (or vice versa).

The cooling component movably connected to the base component can further be operatively connected to the base component by means of a clamping element of the cooling device which can be preloaded and which preferably bears on the one hand on the base component and on the other hand on the cooling component, preferably by means of a spring. In particular by means of such a clamping element, the preloading of which can be effected by a relative movement between the cooling component and the base component which moves or would move the cooling component and the base component toward one another.

The clamping element in its preloaded state can exert forces on the cooling component and on the base component which move or would move the cooling component and the base component away from one another, so that contact or pressing forces can optionally—if it is desired—be exerted on the contact surface of the object to be cooled, so that a stable heat transfer between the heat sink and the contact surface is ensured during operation.

The base component can moreover have a first base body of plastics material, in particular injection-molded plastics material, which is connected in a fluid-tight manner, in particular with the formation of one or more cooling fluid line portions, to a second base body of the base component, which second base body is preferably solid, in particular is deep-drawn and in particular consists of metal or a thermally conducting metal alloy.

One or each hollow body portion of the cooling fluid line portion of the base component can preferably be formed by the first base body of plastics material.

Furthermore, one or each hollow body portion of the cooling fluid line portion of the base component can pass, starting from a first (in particular large-area) face of the second base body of the base component, through a (an optionally respective) through-hole in that second base body and can end at or on the other side of a or the (in particular large-area) face of the second base body that is situated opposite the first face, where it can in particular be connected in an axially movable manner to one or in each case one hollow body portion of the cooling fluid line portion of the cooling component movably connected to the base component.

Moreover, according to a further embodiment of the invention, the second base body of the base component can form at least in some regions a further heat sink for absorbing waste heat from objects to be cooled and for transmitting the waste heat to cooling fluid which flows through the cooling fluid line of the cooling device when the cooling device is in operation. This is effected in particular in that the second base body has at least one cooling region, the inner side of which, which is situated opposite an outer side (in particular directly opposite without any lateral offset) which can be arranged on an object to be cooled, forms a wall inner surface of a cooling fluid line portion of the base component.

The cooling component movably connected to the base component can further have a base body, in particular an injection-molded base body, of plastics material which, together with the heat sink to the inner side of which this base body of the cooling component is connected in a fluid-tight manner, forms a sub-portion of the cooling fluid line portion of the cooling component. The base body of plastics material can further at the same time form or constitute the or each hollow body portion of the cooling fluid line portion of the cooling component, or the hollow body portion(s) can correspondingly be constituted by the base body of plastics material.

The above-mentioned sub-portion of the cooling fluid line portion of the cooling component that is formed by the base body of plastics material of the cooling component and the heat sink of the cooling component and that in particular runs cross-axially can further connect together the two hollow body portions of the cooling fluid line portion of the cooling component in a fluid-conducting manner.

As regards the fluid-tight connection of the first base body of plastics material of the base component of the cooling device to the second base body of the base component and/or the fluid-tight connection of the heat sink of the cooling component to the base body of plastics material of the cooling component, this is preferably a substance-to-substance and/or interlocking connection.

This substance-to-substance and/or interlocking connection can involve nano- and/or micro-structures which have preferably been produced by physical and/or chemical methods and which have been introduced into the surface of the connecting region of the second base body of the base component or into the surface of the connecting region of the heat sink of the cooling component. In particular nano- and/or micro-structures which effect an increase in the size of the surface in the connecting region and/or have depressions comprising undercuts, and/or barbs.

Further features of the present invention will become apparent from the accompanying patent claims, the following description of preferred exemplary embodiments and from the accompanying drawings.

Figure 2:
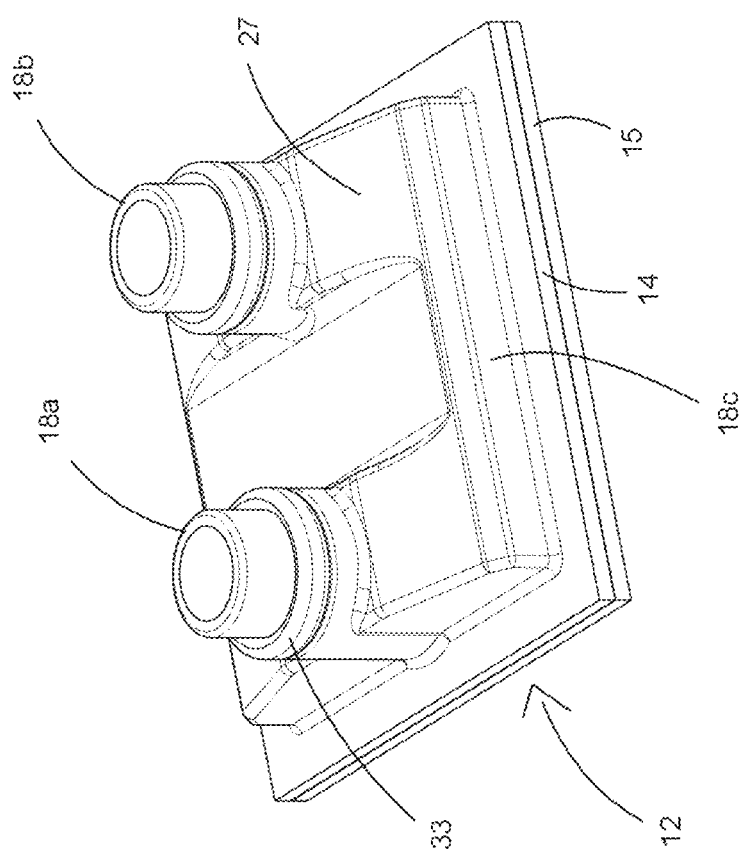
Figure 3:
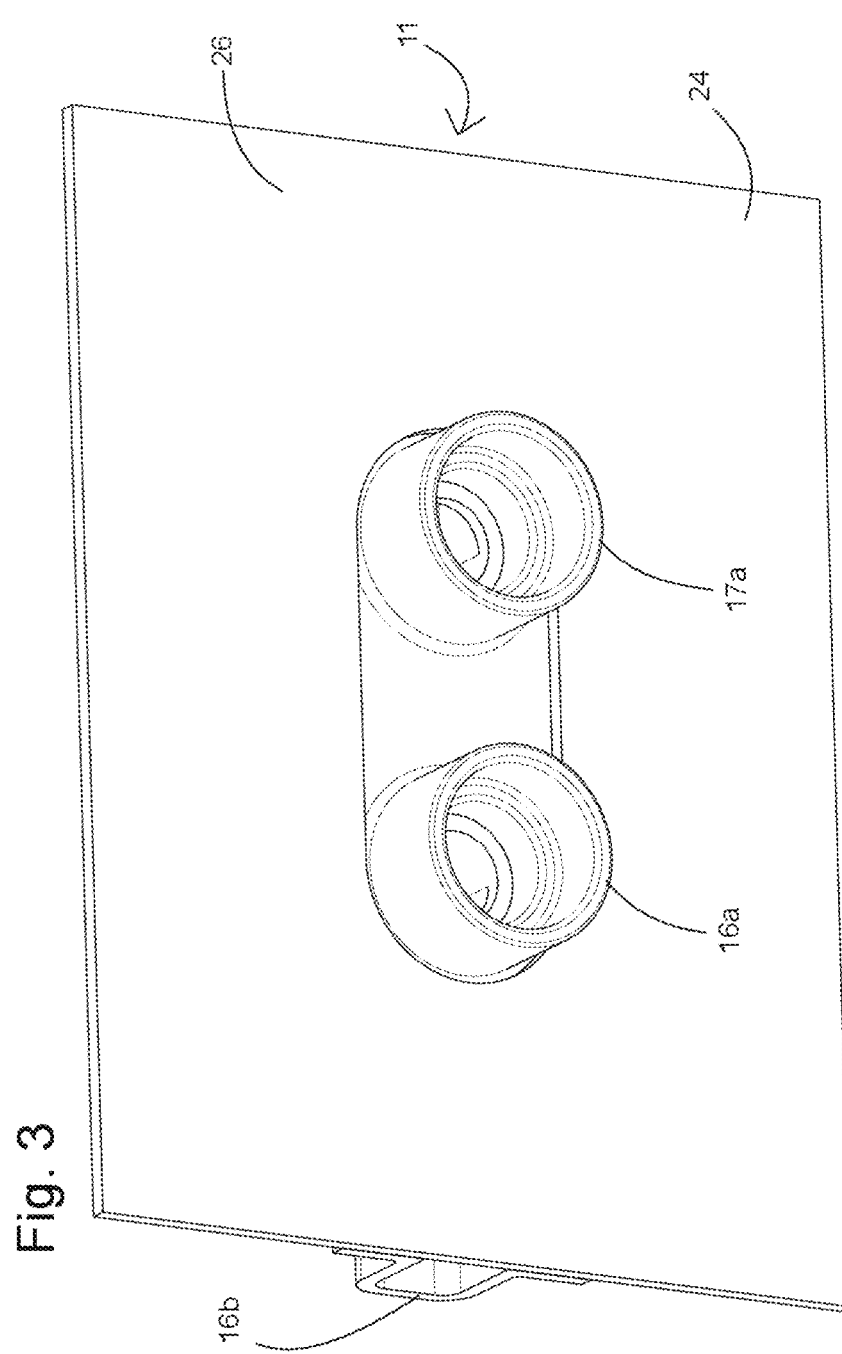
Figure 4:
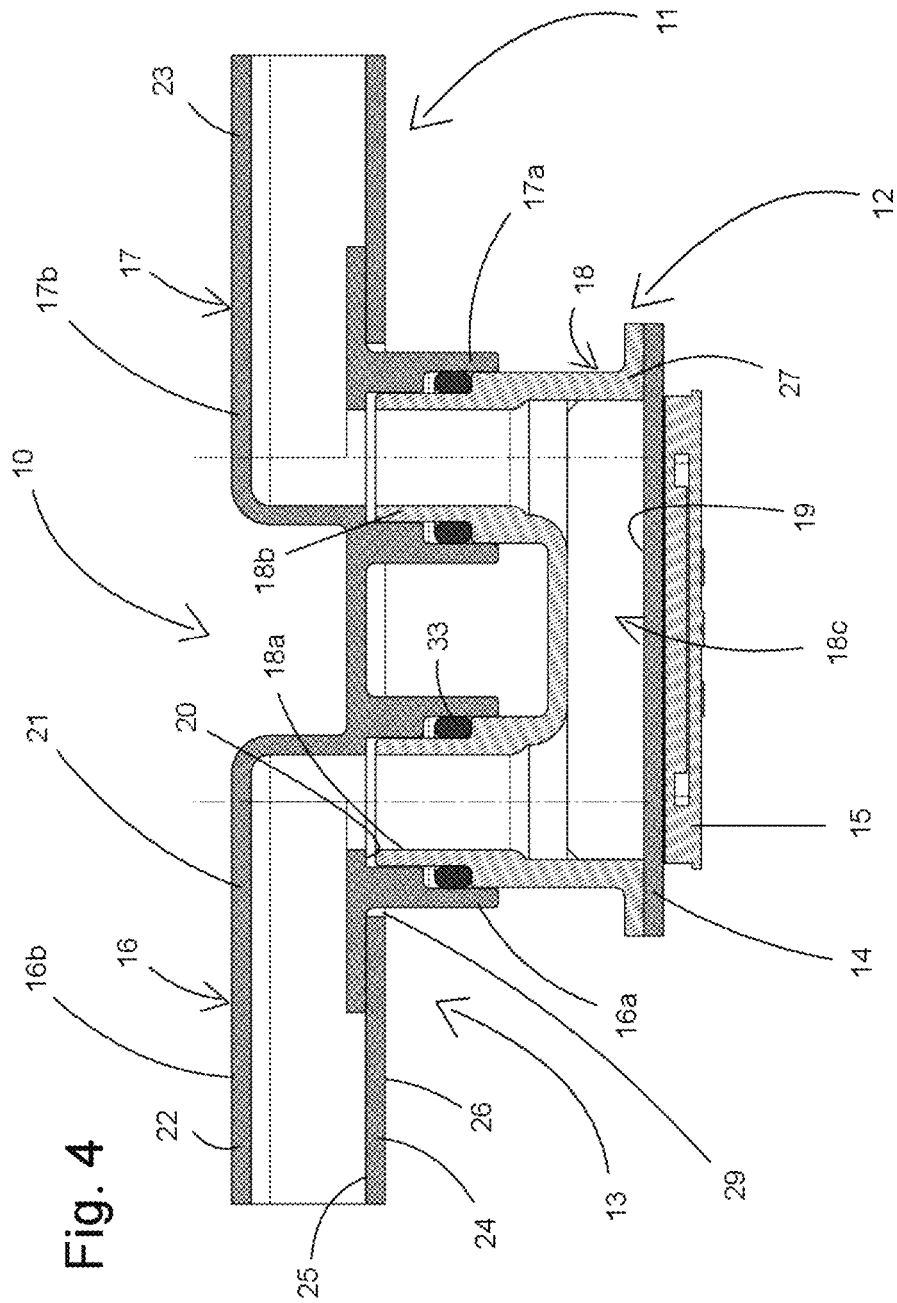
Figure 5:
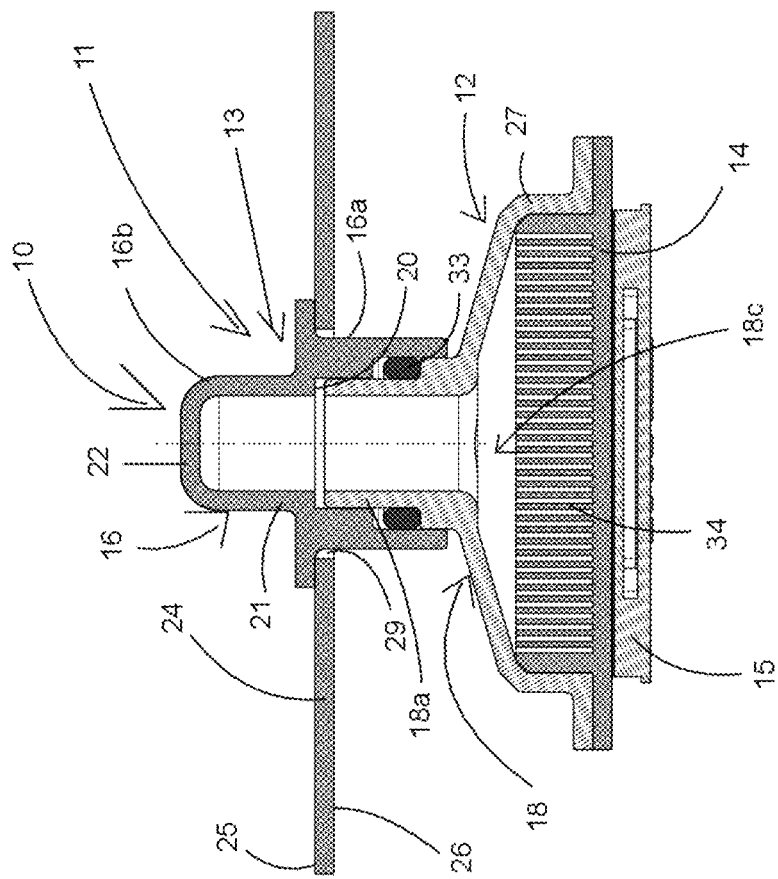
Figure 6:
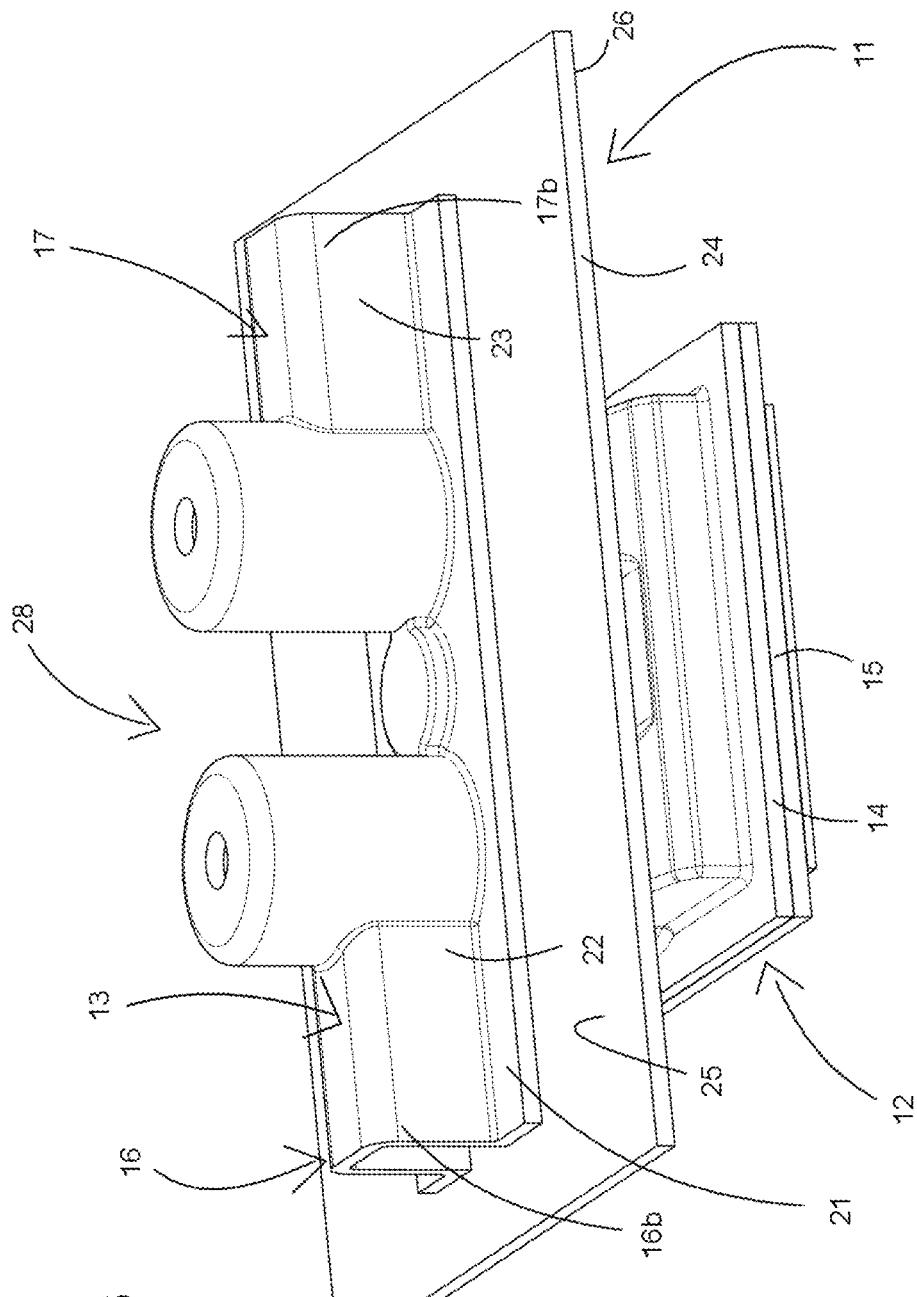
Figure 7:
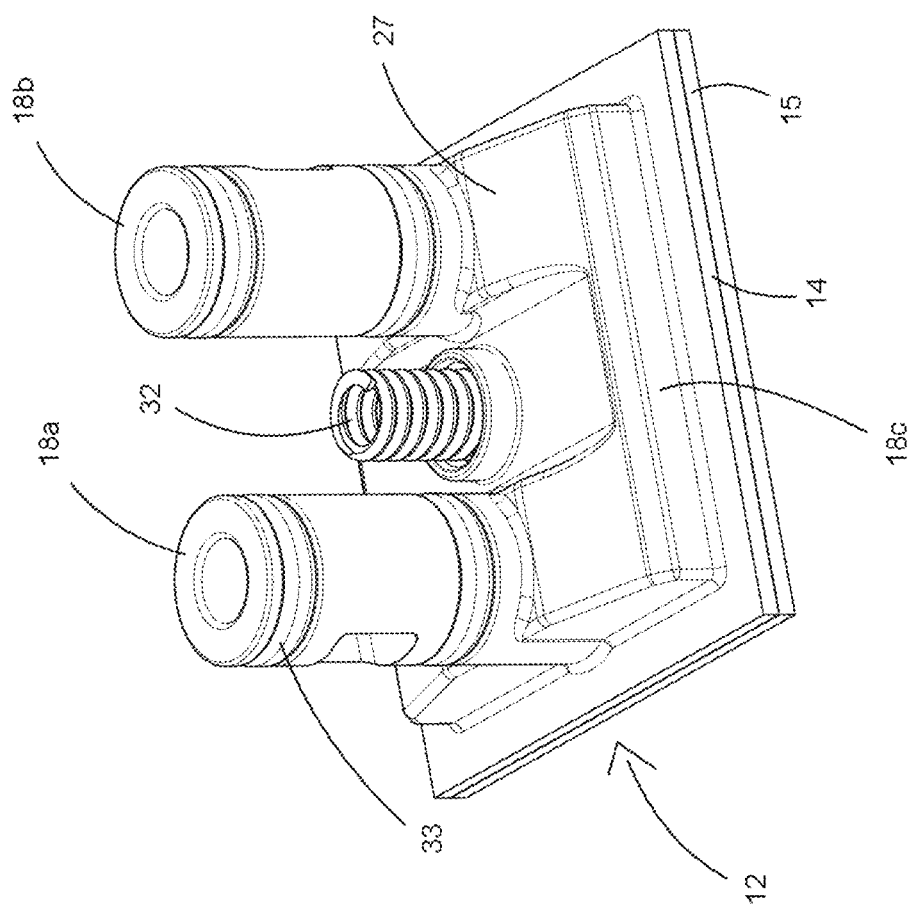
Figure 8:
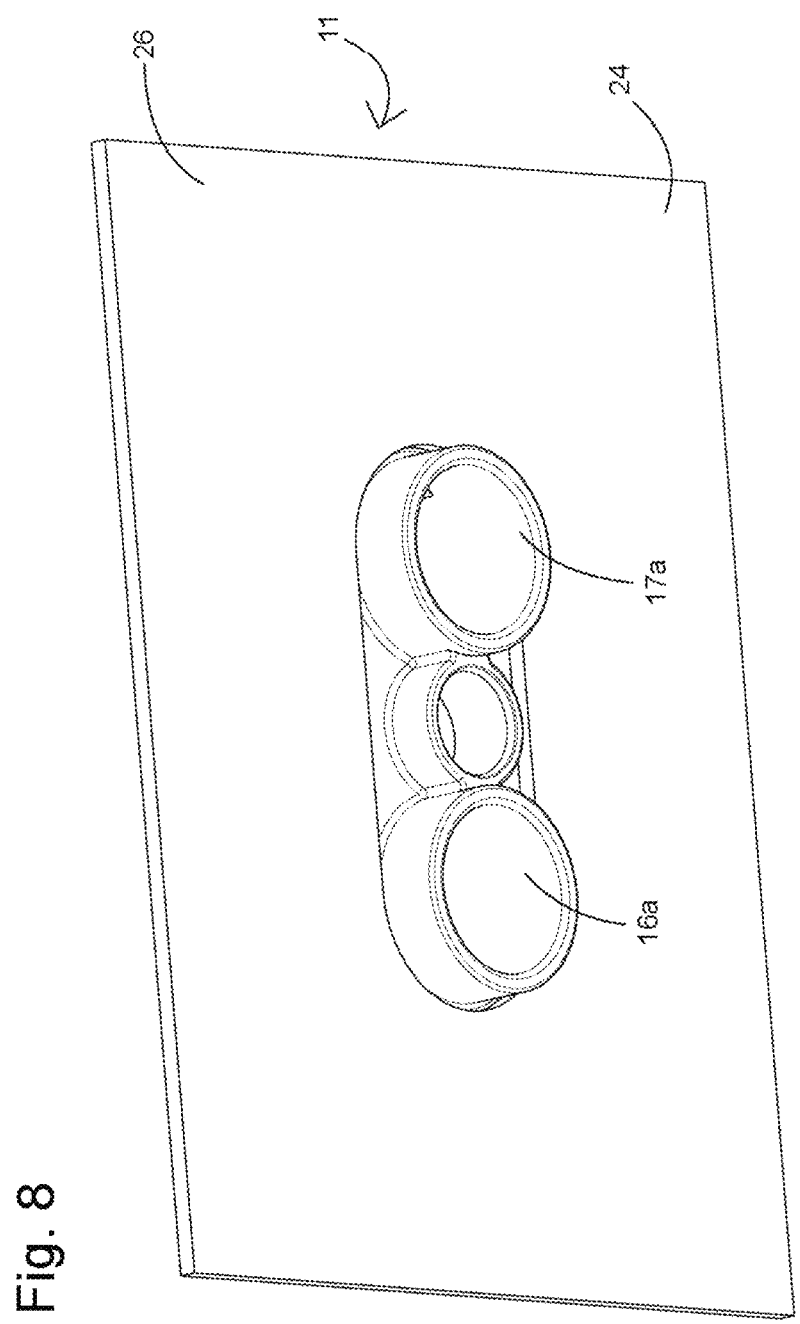
Figure 9:
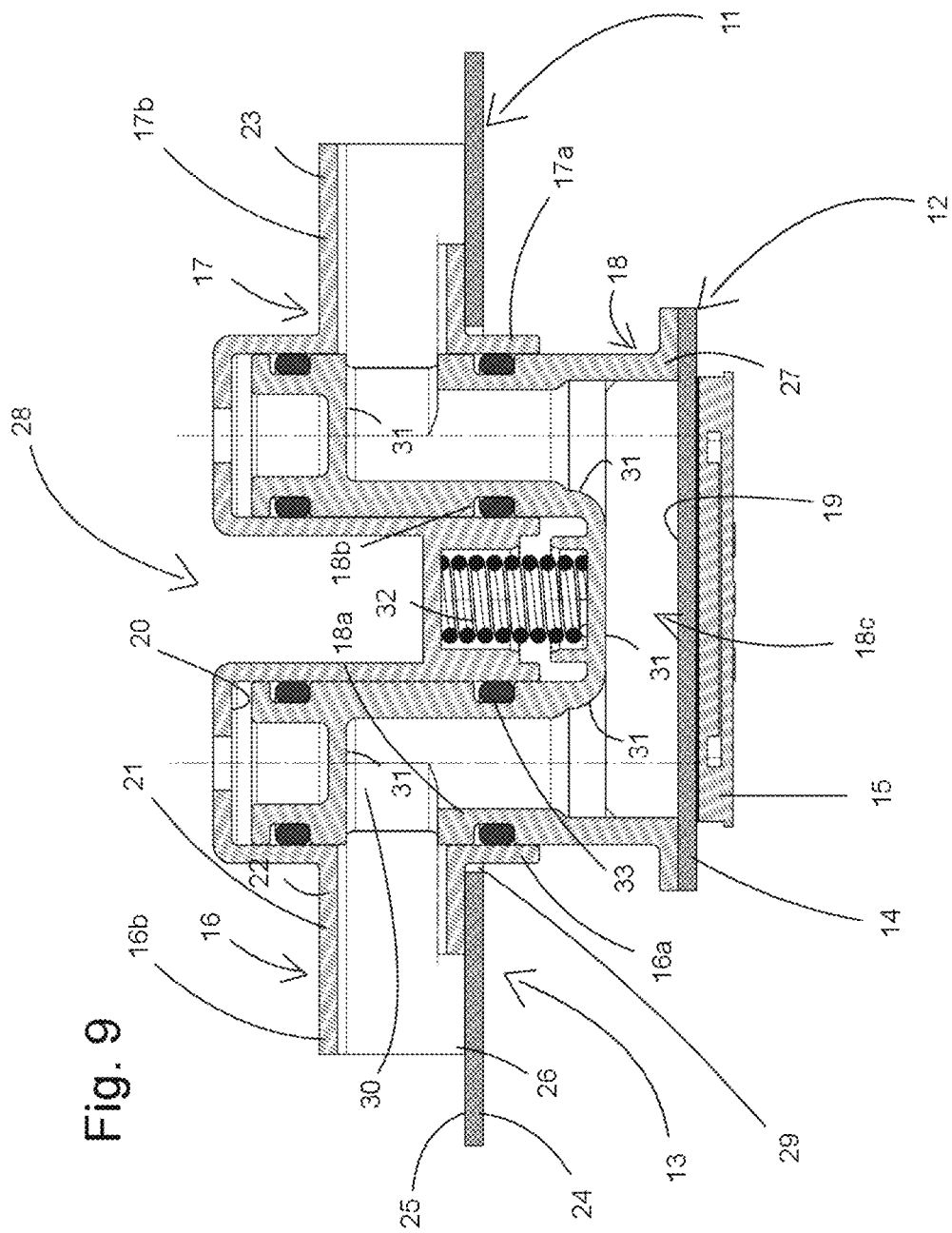

In the figures:

FIG. 1 shows a first embodiment of a cooling device according to the invention having a base component and a cooling component movable relative thereto, in an oblique view from above; together with an object, namely a computer chip, which is to be cooled thereby, FIG. 2 shows an isolated representation of the cooling component of the cooling device of FIG. 1 together with the object to be cooled, in an oblique view from above, FIG. 3 shows an isolated representation of the base component of FIG. 1, in an oblique view from beneath, FIG. 4 shows the cooling device of FIG. 1 with the object to be cooled, in a longitudinal section, FIG. 5 shows the cooling device of FIG. 1 with the object to be cooled, in a transverse section, FIG. 6 shows a second embodiment of a cooling device according to the invention having a base component and a cooling component movable relative thereto, in an oblique view from above; together with an object, namely a computer chip, to be cooled thereby, FIG. 7 shows an isolated representation of the cooling component of the cooling device of FIG. 6 together with the object to be cooled, in an oblique view from above, FIG. 8 shows an isolated representation of the base component of FIG. 6, in an oblique view from beneath, FIG. 9 shows the cooling device of FIG. 6 with the object to be cooled, in a longitudinal section, FIG. 10 shows the cooling device of FIG. 6 with the object to be cooled, in a transverse section.

FIGS. 1-5 show a cooling device 10 which, according to the invention, has a base component 11 and a cooling component 12 which is movable relative thereto.

The cooling device 10 further has a cooling fluid line 13 by way of which cooling fluid, such as, for example, water, can be guided along a heat sink 14 of the cooling device 10 in order to dissipate waste heat of an object 15 to be cooled, here, by way of example, a high-power computer chip, absorbed by the heat sink 14.

The cooling device 10 is part of a cooling system which is otherwise known and which has, inter alia, a cooling fluid source and also a pump which delivers the cooling fluid through the cooling fluid line 13 of the cooling device 10 (in each case not shown).

As will be described in greater detail hereinbelow, the cooling fluid line 13 of the cooling device 10 is composed of a plurality of portions.

The base component 11 here has a cooling fluid line portion 16 and a cooling fluid line portion 17 of the cooling fluid line 13, and the cooling component 12 has a cooling fluid line portion 18.

When the cooling device 10, or the cooling system, is in operation, the cooling fluid is supplied, starting from the cooling fluid source, to the cooling fluid line portion 16 of the base component 11, then flows through the cooling fluid line portion 18 of the cooling component 12, where it absorbs the waste heat of the heat sink 14 (which is here provided with a plurality of cooling fins 34) by flowing along an inner side 19 of the heat sink 14 which forms a wall inner side of the cooling fluid line portion 18, and finally flows into the cooling fluid line portion 17 of the base component 11, from where it is then returned to the cooling fluid source.

Both the cooling fluid line portion 16 and the cooling fluid line portion 17 of the base component 11 each have a terminal hollow body portion 16a or 17a, which in each case forms a first sub-portion of the respective cooling fluid line portion 16 or 17.

The terminal hollow body portions 16a and 17a of the cooling fluid line portions 16 and 17 are here components of a first base body 21 of plastics material, which additionally has line walls 22 and 23 integrally connected to the hollow body portions 16a, 17a.

These line walls 22 and 23, together with a plate-shaped second, solid base body 24 of the base component 11 made of metal, here of aluminum, to which they are connected in a fluid-tight manner, form further cooling fluid line sub-portions 16b and 17b of the respective cooling fluid line 16 or 17, which run perpendicular to the hollow body portions 16a, 17a or cross-axially thereto. The hollow body portions 16a and 17a adjoin these further cooling fluid line portions 16b and 17b in each case directly in a fluid-conducting manner (integrally).

The hollow body portions 16a and 17a of the cooling fluid line portions 16 and 17 of the base component 11 each pass, starting from a first large-area face 25 of the second base body 24 of the base component 11, through a through-hole 29 in this second base body 24 and end at or on the other side of the large-area second face 26 of the second base body 24 situated opposite the first face 25.

The cooling fluid line portion 18 of the cooling component 12 also has in each case hollow body portions 18a and 18b, which correspondingly form sub-portions of the cooling fluid line portion 18 of the cooling component 12.

On the second face 26 of the second base body 24, on the one hand the hollow body portions 16a and 18a are connected together and on the other hand the hollow body portions 17a and 18b are connected together, in each case in pairs.

These connections are configured in such a manner that in each case (sliding) axial relative movements between the hollow body portions of the respective hollow body portion pair 16a, 18a or 17a, 18b are possible (which, for example, could be initiated by a worker as required), so that, ultimately, the base component 11 and the cooling component 12 can also be moved relative to one another.

Each hollow body portion 18a and 18b has, in a connecting region in which the hollow body portions 16a, 18a and 17a, 18b are correspondingly connected together in a sliding manner, a terminal outside diameter which is slightly smaller than the inside diameter of the respective associated hollow body portion 16a or 17a of the cooling fluid line 16 or 17 of the base component 11, so that, when the cooling device 10 is produced, each hollow body portion 18a, 18b was able to be inserted coaxially into the interior of the respective associated hollow body portion 16a or 16b in an accurately fitting manner.

As a result, the hollow body portions 16a and 18a, or the hollow body portions 17a and 18b, and thus also the cooling component 12 on the one hand and the base component 11 on the other hand, can if required each be moved by a worker (while overcoming frictional or holding forces) relative to one another in the axial direction, namely either toward one another or away from one another.

By means of a gasket 33, which is arranged between the pairs of mutually associated hollow body portions 16a, 18a and 17a, 18b so as to contact the hollow body portion 18a or 18b externally and the hollow body portion 16a or 17a internally, fluid tightness is achieved, or it is achieved that fluid cannot flow outward in the connecting region between the hollow body portions of each pair 16a, 18a or 17a, 18b.

As is apparent, the possibilities of moving the cooling component 12 and the base component 11 axially toward one another if required are limited by a stop surface 20, or an end stop, of the hollow body portion 16a or 17a of the base component 11, which is struck by the respective free end of the hollow body portion 18a or 18b optionally of the cooling component 12.

The possibilities of moving the cooling component 12 and the base component 11 axially away from one another are also limited, since, from a certain distance between them, the hollow body portions 18a and 18b would be withdrawn so far from the hollow body portions 16a and 17a that a fluid-tight connection is no longer present.

Moreover, the cooling component 12 movably connected to the base component 11 here has a base body 27, in particular an injection-molded base body, of plastics material, which on the one hand forms the respective sub-portions of the hollow body portions 18a, 18b of the cooling fluid line portion 18 of the cooling component 12 that form the respective sub-portions of the cooling fluid line portion 18, and which on the other hand, together with the heat sink 14, to the inner side 19 of which the base body 27 is connected in a fluid-tight manner, forms a cross-axially running sub-portion 18c of the cooling fluid line portion 18 which connects the two hollow body portions 18a, 18b together in a fluid-conducting manner.

This sub-portion 18c running cross-axially or perpendicularly to the hollow body portions 18a, 18b is formed by the base body 27 and the heat sink 14 of the cooling component 12, or by the inner side 19 thereof.

As regards the fluid-tight connection of the base bodies 21 and 24 of the base component 11 to one another, that is to say of the first base body 21 of plastics material to the second base body 24 of metal, the connection is here a substance-to-substance and/or interlocking connection. This involves nano- and/or micro-structures in the metal surface of the corresponding connection region of the second base body 24 of metal of the base component 11 which have been produced by physical and/or chemical methods. Preferably, they are nano- and/or micro-structures which effect an increase in the size of the metal surface in the connection region and/or have depressions comprising undercuts, and/or barbs.

The fluid-tight connection of the metal heat sink 14 of the cooling component 12 to the plastics base body 27 thereof can also be configured in the same way.

FIGS. 6-10 show a further embodiment 28 of a cooling device according to the invention. Components which are the same or similar are provided with the same reference signs as in the case of the cooling device 10, unless indicated otherwise. Unless indicated otherwise, the differences between the cooling device 28 and the cooling device 10 will primarily be discussed hereinbelow.

A particular feature of the cooling device 28 consists in that the cooling component 12 thereof has suitably arranged and configured force compensation surfaces 31, which ensure that fluid pressure of the cooling fluid which flows through the cooling device 28 when the cooling device is in operation ultimately does not initiate any resultant axial forces (that is to say forces in the movement direction of the cooling component 12 or in the direction of the relative movement between the pairs of hollow body portions 16a, 18a and 17a, 18b) which could damage the object to be cooled 15. This is because any axial forces of the cooling fluid that act on the heat sink 14 in the direction of the object to be cooled 15 are compensated for in the case of the cooling device 28 by corresponding axial counter-forces acting in the opposite direction, which the cooling fluid at the same time exerts on the force compensation surfaces 31.

For this purpose, in the case of the cooling device 28 (in contrast to the cooling device 10), each hollow body portion 18a, 18b extends, starting from the second face 26 of the second base body 24 of the base component 11 (from beneath), through the respective through-hole 29 and ends on the other side, or at the first face 25, of the second base body 24, specifically with the formation of a respective cross-axially running connection channel 30, which adjoins the cooling fluid line portion 16b or 17b extending (coaxially therewith) on the first face 25 of the second base body 24 and the cross-axially extending wall inner surface of which (a region thereof) forms one of the force compensation surfaces 31.

Moreover, the hollow body portions 16a, 17a, into which the hollow body portions 18a and 18b have been inserted, also extend for the large part on the first face 26 of the second base body 24 of the base component 11.

A further particular feature of the cooling device 28 consists in that the cooling component 12 is operatively connected to the base component 11 by means of a clamping element 32 of the cooling device which can be preloaded and here bears on the one hand on the base component 11 and on the other hand on the cooling component 12, here by means of a spring.

By means of the clamping element 32, forces (directed downward in the drawing) are purposively exerted on the cooling component 12 during operation, in which the base component 11 is generally positioned in a static manner, which forces result in the heat sink 14 of the cooling component 12 purposively being pushed or pressed against the object to be cooled 15, so that permanent contact of the heat sink 14 with the object to be cooled 15 and thus optimal heat transfer between the object to be cooled 15 and the heat sink 14 is ensured.

LIST OF REFERENCE SIGNS 10 cooling device
11 base component
12 cooling component
13 cooling fluid line cooling device 14 heat sink
15 object to be cooled
16 cooling fluid line portion base component
16a hollow body portion
16b cooling fluid line sub-portion
17 cooling fluid line portion base component
17a hollow body portion
17b cooling fluid line sub-portion
18 cooling fluid line portion cooling component
18a hollow body portion
18b hollow body portion
18c cross-axial cooling fluid line sub-portion
19 inner side heat sink
20 stop surface hollow body portion
21 first base body base component
22 line wall
23 line wall
24 second base body base component
25 first face second base body base component
26 second face base body base component
27 base body cooling component
28 cooling device
29 through-hole
30 connection channel
31 force compensation surfaces
32 clamping element
33 gasket
34 cooling fins

The invention claimed is:

1. A cooling device for dissipating heat of an object to be cooled, comprising:
a cooling fluid line for passage of cooling fluid,
a base component which has one or more cooling fluid line portions of the cooling fluid line,
a first base body,
a second base body, and
a heat sink, which can be arranged on an object to be cooled, for absorbing waste heat from the object to be cooled and for transmitting the waste heat to cooling fluid which flows through the cooling fluid line of the cooling device when the cooling device is in operation, wherein
the heat sink is arranged on a cooling component of the cooling device which has at least one cooling fluid line portion of the cooling fluid line and which, while connecting that cooling fluid line portion in a fluid-conducting manner to a cooling fluid line portion of the base component, is movably connected to the base component, so that the cooling component and the base component can be moved relative to one another either toward one another or away from one another if required, in order to adjust a position of the heat sink of the cooling component,
wall inner surfaces of the cooling fluid line portion of the cooling component that are situated opposite an inner side of the heat sink form force compensation surfaces, so that axial fluid pressure forces that are effected by the pressure of a fluid flowing through the cooling component and act on the inner side of the heat sink are neutralized by corresponding opposite axial fluid forces acting on the force compensation surfaces,
hollow body portions of the cooling component extend, starting from a second face of the second base body of the base component, through a through-hole and ends on the other side, or at a first face, of the second base body, with formation of a respective cross-axially running connection channel, and
a region of a cross-axially extending wall inner surface of each of the hollow body portions forms one of the force compensation surfaces.

2. The cooling device as claimed in claim 1, wherein the heat sink of the cooling component movably connected to the base component is plate-shaped and/or has cooling fins and extends along a plane which runs at an angle to two opposite movement directions in which the cooling component and the base component can be moved relative to one another toward one another or away from one another if required.

3. The cooling device as claimed in claim 1, wherein the cooling fluid line portion of the base component and the cooling fluid line portion of the cooling component movably connected to the base component each have a terminal hollow body portion, and wherein, for the movable connection of the base component and the cooling component, the two hollow body portions are connected together in an axially movable and fluid-conducting manner.

4. The cooling device as claimed in claim 3, wherein the cooling fluid line portion of the cooling component movably connected to the base component has a second terminal hollow body portion, wherein a second cooling fluid line portion of the base component likewise has a terminal hollow body portion, and wherein, for the movable connection of the base component and the cooling component, two hollow body portions are also connected together in an axially movable and fluid-conducting manner.

5. The cooling device as claimed in claim 1, wherein an inner side of the heat sink, which extends in a cross-axial plane, of the cooling component movably connected to the base component forms one of the wall inner surfaces of the cooling fluid line portion of the cooling component which confine the cooling fluid.

6. The cooling device as claimed in claim 1, wherein one force compensation surface is formed by a wall inner surface of the hollow body portion of the cooling component, which delimits a terminal connection channel of the hollow body portion, by way of which the cooling fluid is able to flow from the cooling fluid portion of the base body to the cooling fluid portion of the cooling component.

7. The cooling device as claimed in claim 1, wherein the cooling component movably connected to the base component is operatively connected to the base component by means of a clamping element of the cooling device which can be preloaded, the preloading of which can be effected by a relative movement between the cooling and the base which moves or could move the cooling and the base toward one another.

8. The cooling device as claimed in claim 7, wherein the clamping element in its preloaded state exerts forces on the cooling component and on the base component which move or would move the cooling component and the base component away from one another.

9. The cooling device as claimed in claim 1, wherein the base component has a first base body of plastics material, which is connected in a fluid-tight manner to a second base body.

10. The cooling device as claimed in claim 9, wherein one or each hollow body portion of the cooling fluid line portion of the base component is formed by the first base body.

11. The cooling device as claimed in claim 9, wherein one or each hollow body portion of the cooling fluid line portion of the base component passes, starting from a first face of the second base body of the base component, through a through-hole in that second base body and ends at or on the other side of the face of the second base body that is situated opposite the first face.

12. The cooling device as claimed in claim 9, wherein the second base body forms at least in some regions a further heat sink for absorbing waste heat from objects to be cooled and for transmitting the waste heat to cooling fluid which flows through the cooling fluid line of the cooling device when the cooling device is in operation.

13. The cooling device as claimed in claim 1, wherein the cooling component movably connected to the base component has a base body of plastics material which, together with the heat sink to the inner side of which the base body of the cooling component is connected in a fluid-tight manner, forms a sub-portion of the cooling fluid line portion of the cooling component, and which forms the hollow body portion of the cooling fluid line portion of the cooling component.

14. The cooling device as claimed in claim 13, wherein the sub-portion of the cooling fluid line portion of the cooling component that is formed by the base body of the cooling component and the heat sink of the cooling component and that runs cross-axially, connects together the two hollow body portions of the cooling fluid line portion of the cooling component in a fluid-conducting manner.

15. The cooling device as claimed in claim 1, wherein a fluid-tight connection of the first and the second base body of the base component and/or a fluid-tight connection of the heat sink of the cooling component to the base body of the cooling component is a substance-to-substance and/or interlocking connection, and the substance-to-substance and/or interlocking connection involves nano- and/or micro-structures which have been produced by physical and/or chemical methods in the surface of a connecting region of the second base body of the base component and in the surface of a connecting region of the heat sink of the cooling component.

* * * * *